(12) United States Patent
Olson et al.

(10) Patent No.: US 11,367,589 B2
(45) Date of Patent: Jun. 21, 2022

(54) MODULATION OF ION BEAM ANGLE

(71) Applicant: Applied Materials, Inc., Santa Clara, CA (US)

(72) Inventors: Joseph C. Olson, Beverly, MA (US); Morgan Evans, Manchester, MA (US); Rutger Meyer Timmerman Thijssen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 111 days.

(21) Appl. No.: 16/705,159

(22) Filed: Dec. 5, 2019

(65) Prior Publication Data

US 2020/0194228 A1    Jun. 18, 2020

Related U.S. Application Data

(60) Provisional application No. 62/780,815, filed on Dec. 17, 2018.

(51) Int. Cl.
| | |
|---|---|
| *H01J 37/12* | (2006.01) |
| *H01J 37/305* | (2006.01) |
| *G02B 6/136* | (2006.01) |
| *H01J 37/147* | (2006.01) |

(Continued)

(52) U.S. Cl.
CPC .......... *H01J 37/3053* (2013.01); *G02B 6/136* (2013.01); *H01J 37/12* (2013.01); *H01J 37/1478* (2013.01); *H01J 37/20* (2013.01); *H01J 37/3056* (2013.01); *G02B 2006/12107* (2013.01); *H01J 2237/1507* (2013.01); *H01J 2237/3174* (2013.01)

(58) Field of Classification Search
CPC .... H01J 37/3053; H01J 37/1478; H01J 37/20; H01J 37/3056; H01J 37/12; H01J 2237/3174; H01J 2237/1507; H01J 2237/3151; H01J 37/15; H01J 37/1472; G02B 6/136; G02B 2006/12107; G02B 5/1847; G02B 5/1861
USPC .......................................... 250/492.1–492.3
See application file for complete search history.

(56) References Cited

U.S. PATENT DOCUMENTS

| | | | |
|---|---|---|---|
| 5,116,461 A | 5/1992 | Lebby et al. | |
| 7,868,305 B2 * | 1/2011 | Gupta | H01J 37/3171 250/492.21 |

(Continued)

FOREIGN PATENT DOCUMENTS

EP    0007108 A1    1/1980

OTHER PUBLICATIONS

International Search Report and Written Opinion in related application PCT/US2019/064592 dated Mar. 23, 2020.

*Primary Examiner* — Michael Maskell
(74) *Attorney, Agent, or Firm* — Patterson + Sheridan, LLP

(57) ABSTRACT

Embodiments described herein relate to methods and apparatus for forming gratings having a plurality of fins with different slant angles on a substrate and forming fins with different slant angles on successive substrates using angled etch systems and/or an optical device. The methods include positioning portions of substrates retained on a platen in a path of an ion beam. The substrates have a grating material disposed thereon. The ion beam is configured to contact the grating material at an ion beam angle θ relative to a surface normal of the substrates and form gratings in the grating material.

18 Claims, 5 Drawing Sheets

(51) Int. Cl.
*H01J 37/20* (2006.01)
*G02B 6/12* (2006.01)

(56) References Cited

U.S. PATENT DOCUMENTS

| | | | |
|---|---|---|---|
| 8,129,695 B2* | 3/2012 | Kellerman | H01J 37/3171 |
| | | | 250/396 R |
| 8,519,353 B2* | 8/2013 | Radovanov | H01J 37/12 |
| | | | 250/396 R |
| 10,302,826 B1 | 5/2019 | Meyer Timmerman Thijssen et al. | |
| 2003/0146707 A1* | 8/2003 | Goldberg | H01J 37/08 |
| | | | 315/111.81 |
| 2003/0197133 A1* | 10/2003 | Turner | H01J 37/20 |
| | | | 250/492.21 |
| 2008/0061228 A1 | 3/2008 | Vanderberg et al. | |
| 2009/0236547 A1* | 9/2009 | Huang | H01J 37/08 |
| | | | 250/492.21 |
| 2009/0314962 A1 | 12/2009 | Dorai et al. | |
| 2012/0292535 A1 | 11/2012 | Choi et al. | |
| 2015/0279612 A1 | 10/2015 | Yagita | |
| 2016/0035539 A1 | 2/2016 | Sainiemi et al. | |
| 2017/0003505 A1 | 1/2017 | Vallius et al. | |

\* cited by examiner

MODULATION OF ION BEAM ANGLE

CROSS-REFERENCE TO RELATED APPLICATION

This application claims benefit of U.S. Provisional Patent Application Ser. No. 62/780,815, filed Dec. 17, 2018, which is hereby incorporated by reference herein.

BACKGROUND

Field

Embodiments of the present disclosure generally relate to angled etch tools. More specifically, embodiments described herein provide for utilizing angled etch tools to form gratings having fins with modulated slant angles.

Description of the Related Art

To form gratings with different slant angles on a substrate angled etch systems are used. Angled etch systems include an ion beam chamber that houses an ion beam source. The ion beam source is configured to generate an ion beam, such as a ribbon beam, a spot beam, or full substrate-size beam. The ion beam chamber is configured to direct the ion beam at an optimized angle relative to a surface normal of a substrate. Changing the optimized angle requires reconfiguration of the hardware configuration of the ion beam chamber. The substrate is retained on a platen coupled to an actuator. The actuator is configured to tilt the platen, such that the substrate is positioned at a tilt angle relative to an axis of the ion beam chamber. The optimized angle and tilt angle result in an ion beam angle relative to the surface normal.

One example of a device that utilizes gratings with different slant angles is an optical device, such as a waveguide combiner. Optical devices may require gratings with slant angles that are different depending on the properties required for augmented reality. Additionally, gratings of an optical device may require gratings having fins with slant angles to change, e.g., increase or decrease, across the region to adequately control the in-coupling and out-coupling of light. Modulating the change in the slant angle of the fins, i.e. the rolling k-vector, using angled etch systems can be challenging.

Accordingly, what is needed in the art are methods of forming gratings with having fins with modulated slant angles.

SUMMARY

In one embodiment, a grating forming method is provided. The method includes positioning a first portion of a substrate retained on a platen in a path of an ion beam with a first beam angle $\alpha$. The substrate has a grating material disposed thereon. The ion beam contacts the grating material at a first ion beam angle $\vartheta$ relative to a surface normal of the substrate and forms one or more first gratings in the grating material with a first slant angle $\vartheta'$. The first beam angle $\alpha$ is modulated to a second beam angle $\alpha$ different that the first beam angle $\alpha$. A second portion of the substrate is positioned in the path of the ion beam with a second beam angle $\alpha$. The ion beam contacts the grating material at a second ion beam angle $\vartheta$ relative to the surface normal of the substrate and forms one or more second gratings in the grating material with a second slant angle $\vartheta'$ different than the first slant angle $\vartheta'$.

In another embodiment, a grating forming method is provided. The method includes positioning a first portion of a substrate retained on a platen at a first tilt angle $\beta$ relative to an x-axis of an ion beam chamber. The first portion of the substrate at the first tilt angle $\beta$ is positioned in a path of an ion beam generated by the ion beam chamber with a beam angle $\alpha$. The substrate has a grating material disposed thereon. The ion beam contacts the grating material at a first ion beam angle $\vartheta$ relative to a surface normal of the substrate and forms one or more first gratings in the grating material with a first slant angle $\vartheta'$. A second portion of the substrate is positioned at a second tilt angle $\beta$ different than the first tilt angle $\beta$. The second portion of the substrate at the second tilt angle $\beta$ is positioned in the path of the ion beam with the beam angle $\alpha$. The ion beam contacts the grating material at a second ion beam angle $\vartheta$ relative to the surface normal of the substrate and forms one or more second gratings in the grating material with a second slant angle $\vartheta'$.

In yet another embodiment, a grating forming method is provided. The method includes positioning a first portion of a substrate retained on a platen in a path of an ion beam with a beam angle $\alpha$. The substrate has a grating material disposed thereon. The ion beam is configured to contact the grating material at an ion beam angle $\vartheta$ relative to a surface normal of the substrate and form one or more first gratings in the grating material. The substrate retained on the platen is rotated about an axis of the platen resulting in a first rotation angle $\phi$ between the ion beam and a grating vector of the one or more first gratings. The one or more first gratings have a first slant angle $\vartheta'$ relative to the surface normal of the substrate. A second portion of the substrate is positioned in the path of the ion beam configured to form one or more second gratings in the grating material. The substrate is rotated about the axis of the platen resulting in a second rotation angle $\phi$ between the ion beam and the grating vector of the one or more second gratings. The one or more second gratings having a second slant angle $\vartheta'$ relative to the surface normal of the substrate.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to angled etch tools. More specifically, embodiments described herein provide for utilizing angled etch tools to form gratings having fins with modulated or varied slant angles.

Figure 1A:
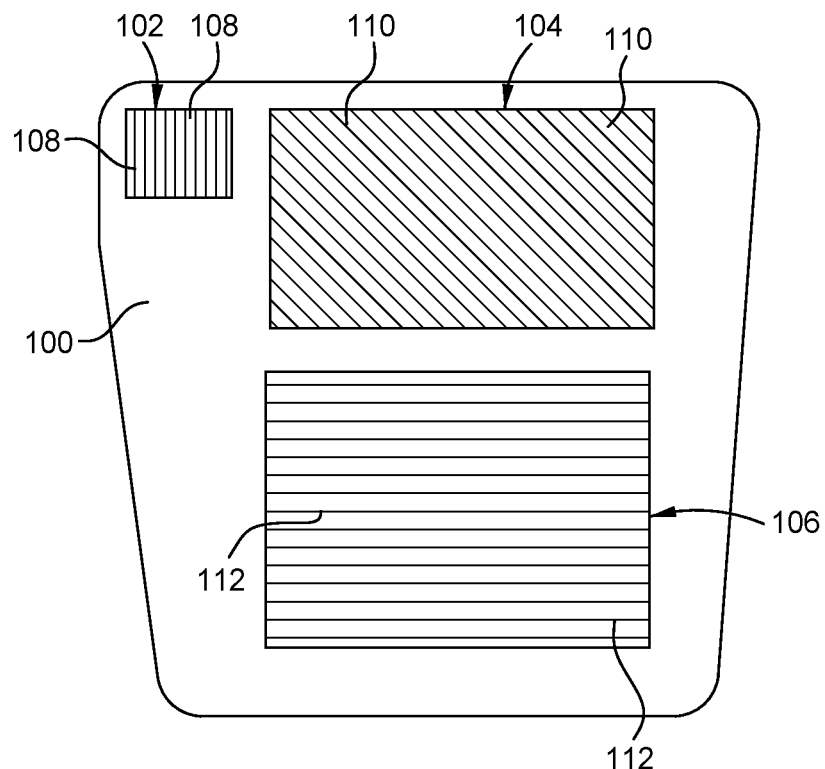
FIG. 1A is a perspective, frontal view of a waveguide combiner according to an embodiment.

FIG. 1A is a perspective, frontal view of waveguide combiner 100. The waveguide combiner 100 includes an input coupling grating region 102 (a first region) defined by a plurality of fins 108, an intermediate grating region 104 (a second region) defined by a plurality of fins 110, and an output coupling grating region 106 (a third region) defined by a plurality of fins 112. Each of the plurality of fins 108, 110 and 112 are formed by a grating modulation process as described herein. For example, one or more of the plurality of fins 108, 110 and 112 are different from the other fins within the same region. In one example, one or more of the plurality of fins 108 within the input coupling grating region 102 has a different geometry, such as a different slant angle from that of other fins in that region. In addition, a slant angle of one discreet fin 108 within the input coupling grating region 102 may be different across the length or width of the input coupling grating region 102. One or more of the plurality of fins 110 and 112 of the intermediate grating region 104 and the output coupling grating region 106, respectively, may be formed to have a different geometry also.

Figure 1B:
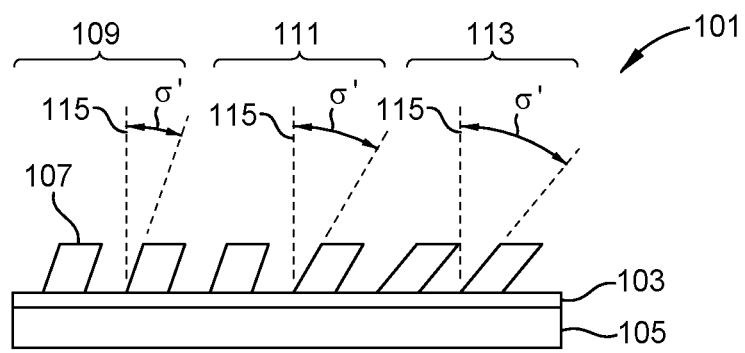
FIG. 1B is a schematic, cross-sectional view of a region of a waveguide combiner according to an embodiment.

FIG. 1B is a schematic, cross-sectional view of a region 101 of the waveguide combiner 100. The region 101 may be one of the input coupling grating region 102, the intermediate grating region 104, and the output coupling grating region 106.

The region 101 includes a grating material 103 disposed on a substrate 105. The grating material 103 includes at least one of silicon oxycarbide (SiOC), titanium oxide (TiO$_x$), TiO$_x$ nanomaterials, niobium oxide (NbO$_x$), niobium-germanium (Nb$_3$Ge), silicon dioxide (SiO$_2$), silicon oxycarbonitride (SiOCN), vanadium (IV) oxide (VOx), aluminum oxide (Al$_2$O$_3$), indium tin oxide (ITO), zinc oxide (ZnO), tantalum pentoxide (Ta$_2$O$_5$), silicon nitride (Si$_3$N$_4$), Si$_3$N$_4$ silicon-rich, Si$_3$N$_4$ hydrogen-doped, Si$_3$N$_4$ boron-doped, silicon carbon nitrate (SiCN), titanium nitride (TiN), zirconium dioxide (ZrO$_2$), germanium (Ge), gallium phosphide (GaP), poly-crystalline (PCD), nanocrystalline diamond (NCD), and doped diamond containing materials.

The grating material 103, in accordance with the methods described herein, includes a plurality of fins 107 having two or more portions of fins, such as a first portion of fins 109, a second portion of fins 111, and a third portion of fins 113. Each of the portions of fins has a different slant angle $\vartheta'$ relative to a surface normal 115 of the substrate 105. In one embodiment, as shown, which can be combined with other embodiments described herein, the slant angle $\vartheta'$ of the fins increases across the substrate 105. In another embodiment, which can be combined with other embodiments described herein, the slant angle $\vartheta'$ of the fins decreases across the substrate 105. The increase and or decrease of the slant angle $\vartheta'$ is also known as a rolling k-vector.

Figure 2:
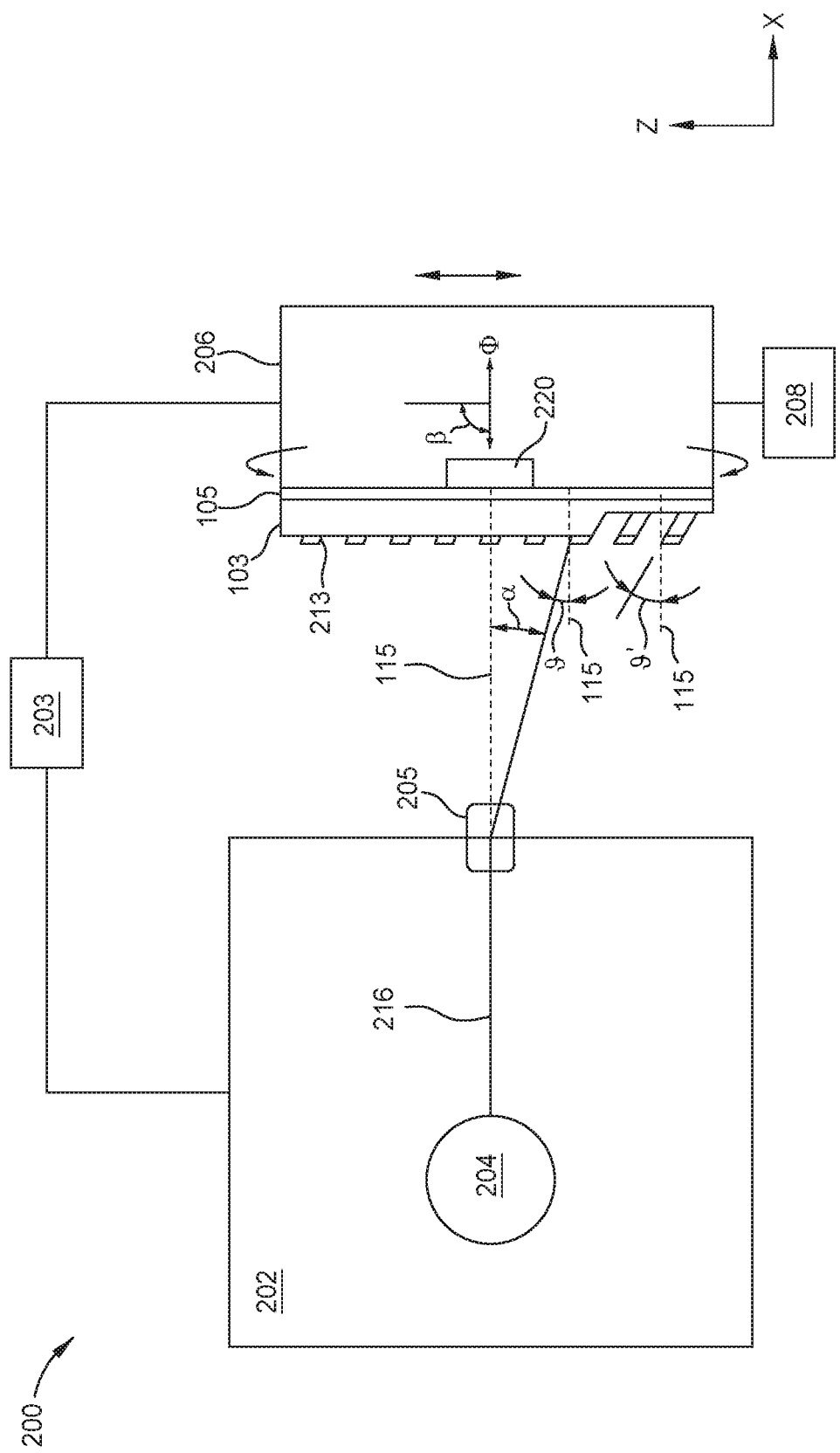
FIG. 2 is a side, schematic cross-sectional view of a variable angle etch system according to an embodiment.

FIG. 2 is a side, schematic cross-sectional view of a variable angle etch system 200. It is to be understood that the variable angle etch system 200 described below is an exemplary variable angle etch system and other variable angle etch systems, including angled etch systems from other manufacturers, may be used with or modified to form gratings and/or graded fins (one or more fins having a variable slant angle $\vartheta'$ as opposed to other fins) on a substrate in accordance with the methods described herein. A controller 203 operable to control aspects of the variable angle etch system 200 during processing.

To form gratings having fins with varied slant angles $\vartheta'$, the grating material 103 is disposed on a substrate 105 is etched by the variable angle etch system 200. In one embodiment, which can be combined with other embodiments described herein, a patterned hardmask 213 is disposed over the grating material 103. The patterned hardmask 213 may be an opaque or non-transparent hardmask that is removed after the grating is formed. A transparent patterned hardmask (not shown) may remain after the grating is formed. The variable angle etch system 200 includes a triode extraction assembly 205. An ion beam housing 202 that houses an ion beam source 204 is at least partially positioned in the ion beam housing 202. The ion beam source 204 is configured to generate an ion beam 216, such as a ribbon beam, a spot beam, or full substrate-size beam (e.g., a flood beam). The variable angle etch system 200 is operable to direct the ion beam 216 at a beam angle α relative to a surface normal 115 of the substrate 105.

The substrate 105 is retained on a platen 206 in proximity to the ion beam housing 202. The platen 206 is coupled to a scan and tilt actuator 208. The scan and tilt actuator 208 is operable to move the platen 206 in a scanning motion along a y-direction and a z-direction, and is operable to tilt the platen 206, such that the substrate 105 is positioned at a tilt angle β relative to the x-axis of the ion beam housing 202. The beam angle α and tilt angle β result in an ion beam angle $\vartheta$ relative to the surface normal 115. To form gratings having a slant angle $\vartheta'$ relative the surface normal 115, the ion beam source 204 generates an ion beam 216 and the ion beam housing 202 directs the ion beam 216 towards the substrate 105 at the beam angle α. The scan and tilt actuator 208 positions the platen 206 so that the ion beam 216 contacts the grating material 103 at the ion beam angle $\vartheta$ and etches gratings having a slant angle $\vartheta'$ on desired portions of the grating material 103. A rotation actuator 220 is coupled to the platen 206 to rotate the substrate 105 about the x-axis of the platen 206 to control the slant angle $\vartheta'$ of gratings. In the methods described herein, the slant angles $\vartheta'$ of the two or more portions of fins, such as a first portion of fins 109, a second portion of fins 111, a third portion of fins 113, are modulated for the rolling k-vector via modulating the beam angle α, the tilt angle β, and a rotation angle φ, or combinations thereof.

In one embodiment, which can be combined with other embodiments described herein, the variable angle etch system 200 includes the triode extraction assembly 205 operable to modulate and/or vary the beam angle α. The triode extraction assembly 205 may include at least one of a plurality of actuated deflector plates and an electrode set or assembly described below. The triode extraction assembly 205 is positioned downstream of the ion beam source 204.

Figure 3:
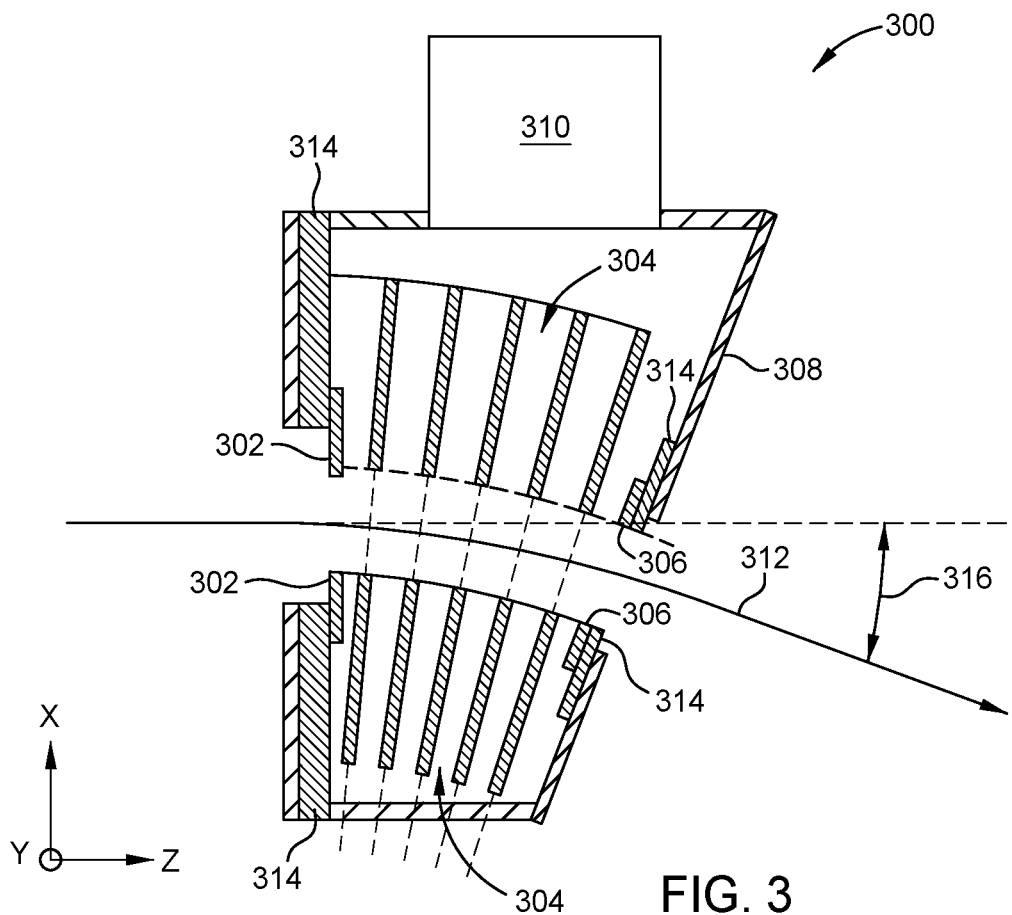
FIG. 3 is a schematic, cross-sectional view of an electrode assembly according to one embodiment.

FIG. 3 depicts a side sectional view of an exemplary electrode assembly 300 that may be used as the triode extraction assembly 205 of FIG. 2. The electrode assembly 300 may be adapted as a graded lens configuration. The electrode assembly 300 may include several sets of electrodes. For example, the electrode assembly 300 may include a set of entrance electrodes 302, one or more sets of suppression electrodes 304 (or focusing electrodes), and a set of exit electrodes 306. The exit electrodes 306 may be referred to as ground electrodes. Each set of electrodes may have a space/gap to allow an ion beam 312 (e.g., a ribbon beam, a spot beam, or full substrate-size beam) to pass therethrough.

In some embodiments, the entrance electrodes 302, the suppression electrodes 304, and the exit electrodes 306 are be provided in a housing 308. A pump 310 may be directly or indirectly connected to the housing 308. The pump 310 may be a vacuum pump for providing a high-vacuum environment or other controlled environment of a different vacuum level. In other embodiments, which may be combined with other embodiments, the housing 308 may include one or more dielectric members 314. The dielectric members 314 may be used to electrically isolate the housing 308 from other components.

As shown in FIG. 3, the set of entrance electrodes 302 and exit electrodes 306 may include two conductive pieces electrically coupled to each other. In other embodiments, the set of entrance electrodes 302 may be a one-piece structure with an aperture for the ion beam 312 to pass therethrough. In some embodiments, upper and lower portions of suppression electrodes 304 may have different potentials (e.g., in separate/discreet conductive portions) in order to deflect the ion beam 312 passing therethrough. Although the electrode assembly 300 is depicted as a seven (7) element lens configuration (e.g., with five (5) sets of suppression electrodes 304), it should be appreciated that any number of elements (or electrodes) may be utilized. For example, in some embodiments, the electrode assembly 300 may utilize a range of three (3) to ten (10) electrode sets. In some embodiments, the ion beam 312 passing through the electrodes may include argon or other elements.

Electrostatic focusing of the ion beam 312 may be achieved by using several thin electrodes (e.g., the suppression electrodes 304) to control grading of potential along a path the ion beam 312. As a result, the use of input ion beams 312 may be used in an energy range that may enable higher-quality beams, even for very low energy output beams. In one embodiment, as the ion beam 312 passes through the electrodes of the electrode assembly 300, the ion beam 312 may be decelerated from 6 keV to 0.2 keV and deflected at about 15 degrees to about 30 degrees, or greater, by the electrodes of the electrode assembly 300. In one example, the energy ratio may be 30/1. In other embodiments, the input power may be 100 Volts to 3,000 Volts to deflect the ion beam 312 by about 15 degrees to about 30 degrees, or greater.

It should be appreciated that separating and independently controlling deceleration, deflection, and/or focus may be accomplished by one or a combination of moving the electrodes (e.g., the entrance electrode 302, suppression electrodes 304, and the exit electrode 306) with respect to a central ray trajectory of the ion beam 312, and varying deflection voltages electrodes (e.g., the entrance electrode 302, suppression electrodes 304, and the exit electrode 306) along the central ray trajectory of the ion beam 312 to reflect beam energy at each point along the central ray trajectory at a deflection angle 316. The symmetry of the electrodes with respect to the central ray trajectory of the ion beam 312 is where the ends of upper and lower electrodes closest to the ion beam 312 may be maintained at equal (or near-equal) perpendicular distances from the central ray trajectory of the ion beam 312. For example, a difference in voltages on electrodes above and below the ion beam 312 may be configured so that a deflection component of the electric field may be a fixed ratio/factor of the beam energy at that point (which may vary along the electrodes or lenses).

Figure 4:
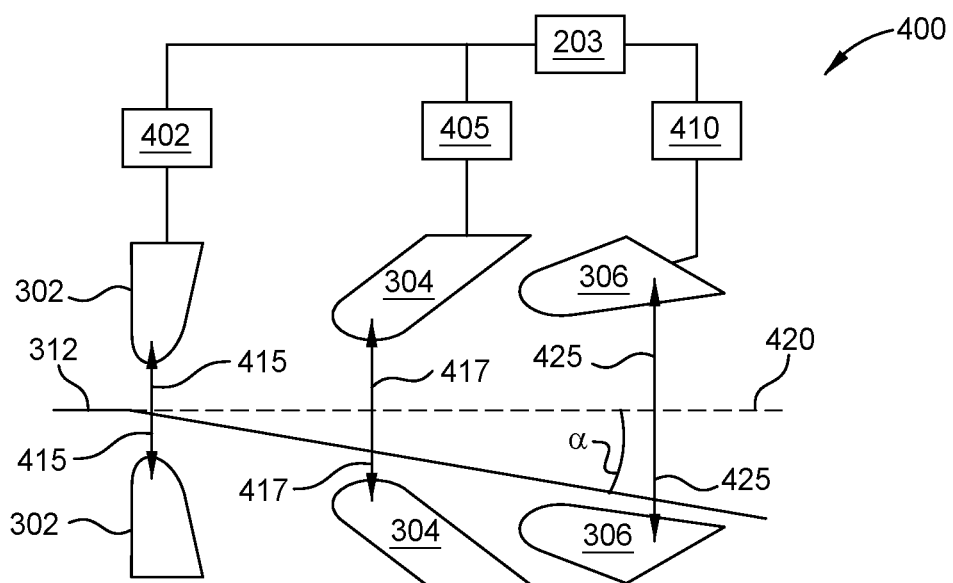
FIG. 4 is a schematic, cross-sectional view of an electrode assembly according to another embodiment.

FIG. 4 is a schematic, cross-sectional view of an electrode assembly 400 according to another embodiment that may be used as the triode extraction assembly 205 of FIG. 2. The electrode assembly 400 includes a pair of entrance electrodes 302 coupled to a first actuator 402, a pair of suppression electrodes 304 coupled to a second actuator 405, and a pair of exit electrodes 306 (e.g., ground electrodes) coupled to a third actuator 410. The first actuator 402 is operable to move one or both of the entrance electrodes 302 a first distance 415 from a midline 420 to modulate the beam angle $\alpha$ of the ion beam 312. The second actuator 405 is operable to move one or both of the suppression electrodes 304 a second distance 417 from the midline 420 to modulate the beam angle $\alpha$ of the ion beam 312. The midline 420 corresponds to a normal of the ion beam 312 prior to modulation of the beam angle $\alpha$ of the ion beam 312 by one or more of the entrance electrodes 302, the suppression electrodes 304 and the exit electrodes 306. The third actuator 410 is operable to move the one or both of the exit electrodes 306 a third distance 425 from the midline 420 to modulate the beam angle $\alpha$ of the ion beam 312. The first actuator 402, the second actuator 405, and the third actuator 410 are coupled to the controller 203 operable to operable to control aspects of the variable angle etch system 200 during processing, such as the methods described herein. The controller 203 is configured to control voltages.

Figure 5:
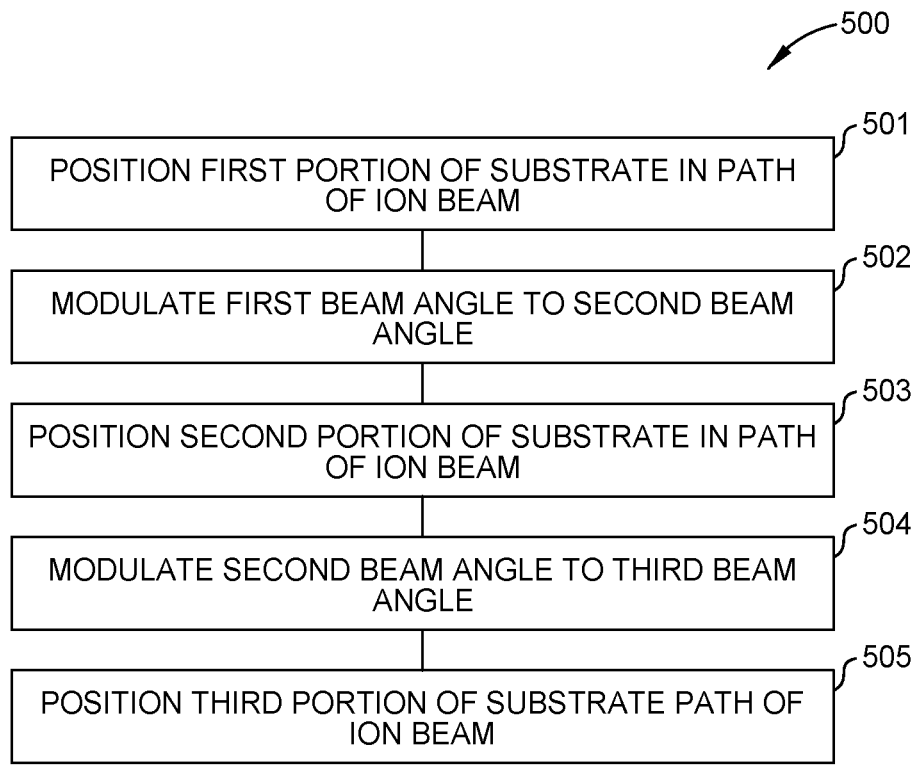
FIG. 5 is a flow diagram of a method of forming gratings with rolling-k vector slant angles according to an embodiment.

FIG. 5 is a flow diagram of a method 500 of forming gratings with rolling-k vector slant angles. To facilitate explanation, FIG. 5 will be described with reference to FIGS. 2, 3 and 4, as applicable. References to an ion beam in the following may refer to the ion beam 216 of FIG. 2 and/or the ion beam 312 of FIGS. 3 and 4.

At operation 501, a first portion of a substrate 105 having a grating material 103 disposed thereon is positioned in a path of the ion beam. The ion beam with a first beam angle $\alpha$ contacts the grating material 103 at an ion beam angle $\vartheta$ relative to a surface normal 115 of the substrate 105 and forms one or more first gratings in the grating material 103 having a first slant angle $\vartheta'$. At operation 502, the first beam angle $\alpha$ is modulated to a second beam angle $\alpha$ different than the first beam angle $\alpha$. The second beam angle $\alpha$ may be greater or less than the first beam angle $\alpha$. At operation 503, a second portion of a substrate 105 having the grating material 103 disposed thereon is positioned in the path of the ion beam with the second beam angle $\alpha$. The second beam angle $\alpha$ greater than the first beam angle $\alpha$ will result in one or more second gratings in the grating material 103 having a second slant angle $\vartheta'$ greater than the first slant angle $\vartheta'$. The second beam angle $\alpha$ less than the first beam angle $\alpha$ will result in a second slant angle $\vartheta'$ less than the first slant angle $\vartheta'$. At operation 504, the second beam angle $\alpha$ is modulated to a third beam angle $\alpha$ different that the second beam angle $\alpha$. At operation 505, a third portion of a substrate 105 having the grating material 103 disposed thereon is positioned in the path of the ion beam with the third beam angle $\alpha$ to form one or more third gratings in the grating material 103 having a third slant angle $\vartheta'$ different than the second slant angle $\vartheta'$. In embodiments, which can be combined with other embodiments described herein, the first, second, and third beam angles α are modulated by at least one of a plurality of actuated deflector plates and an electrode assembly 400 or the electrode assembly 300 as described above.

In one example, the first actuator 402 moves the entrance electrode(s) 302 a first distance 415 from the midline 420 to modulate the beam angle α of the ion beam 312 to modulate the beam angle α of the ion beam 312. Alternatively or additionally, the second actuator 405 moves the suppression electrode(s) 304 a second distance 417 from the midline 420 to modulate the beam angle α of the ion beam 312. Alternatively or additionally, the third actuator 410 moves the exit electrode(s) 306 a third distance 425 from the midline 420 to modulate the beam angle α of the ion beam 312. The modulation of the beam angle α changes the slant angle $\vartheta'$ of the fins as described above.

In another example, which may be utilized alone or in combination with the example above, deflection voltages of the electrodes (e.g., the entrance electrode(s) 302, suppression electrode(s) 304 (or focusing electrode(s)), and the exit electrode(s) 306) may be varied to produce varying slant angles $\vartheta'$ of the fins as described above.

Figure 6:
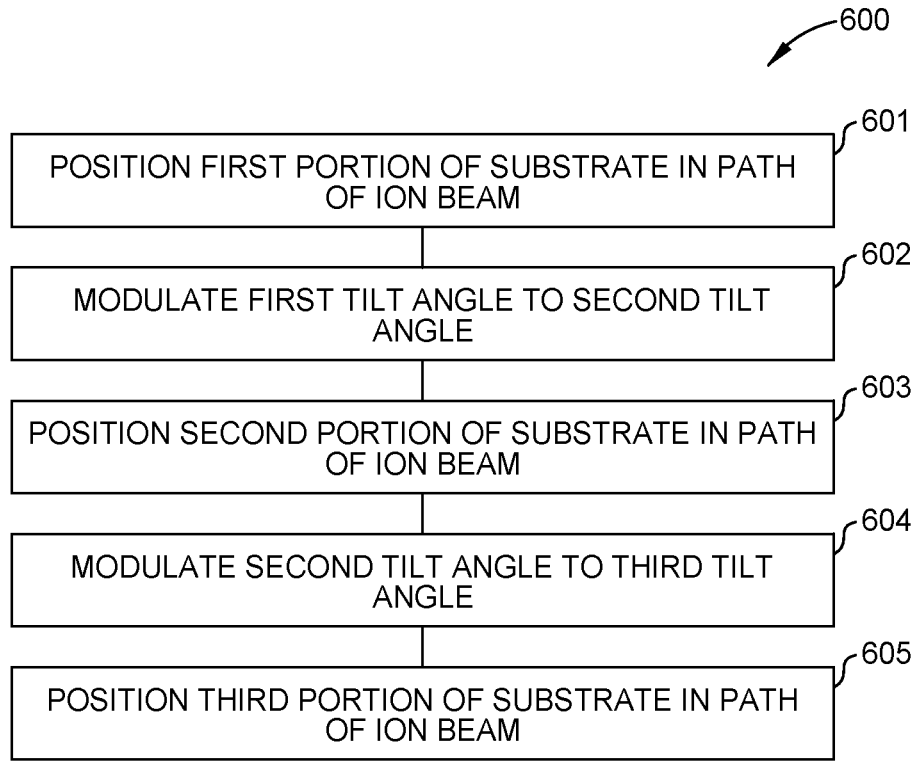
FIG. 6 is a flow diagram of a method of forming gratings with rolling-k vector slant angles according to an embodiment.

FIG. 6 is a flow diagram of a method 600 of forming gratings with rolling-k vector slant angles. To facilitate explanation, FIG. 6 will be described with reference to FIG. 2. However, it is to be noted that an angled etch system other than the variable angle etch system 200 may be utilized in conjunction with the method 600. In other embodiments, which can be combined with other embodiments described herein, the method 600 is performed by an ion beam etch system. References to an ion beam in the following may refer to the ion beam 216 of FIG. 2 and/or the ion beam 312 of FIGS. 3 and 4.

At operation 601, a first portion of a substrate 105 having a grating material 103 disposed thereon is positioned in a path of the ion beam. The substrate 105 is positioned at a first tilt angle β relative to the x-axis of the ion beam housing 202. The ion beam with a beam angle α contacts the grating material 103 at an ion beam angle $\vartheta$ relative to a surface normal 115 of the substrate 105 and forms one or more first gratings in the grating material 103 having a first slant angle $\vartheta'$. At operation 602, the first tilt angle β is modulated to a second tilt angle β different that the first tilt angle β. The second beam tilt angle β may be greater or less than the first tilt angle β. At operation 603, a second portion of a substrate having the grating material 103 disposed thereon is positioned in the path of the ion beam with the beam angle α. The second tilt angle β greater than the first tilt angle β will result in one or more second gratings in the grating material 103 having a second slant angle $\vartheta'$ greater than the first slant angle $\vartheta'$. The second beam angle α less than the first beam angle α will result in a second slant angle $\vartheta'$ less than the first slant angle $\vartheta$. At operation 604, the tilt angle β is modulated to a third tilt angle β different that the second tilt angle β. At operation 605, a third portion of a substrate having the grating material 103 disposed thereon is positioned in the path of the ion beam with the beam angle α to form one or more third gratings in the grating material 103 having a third slant angle $\vartheta'$ greater than the second slant angle $\vartheta'$. In embodiments, which can be combined with other embodiments described herein, scan and tilt actuator 208 moves the platen 206 in a scanning motion along at least one of a y-direction and a z-direction, tilts the platen 206 at the first, second, and third tilt angles β relative to the x-axis of the ion beam housing 202.

Figure 7:
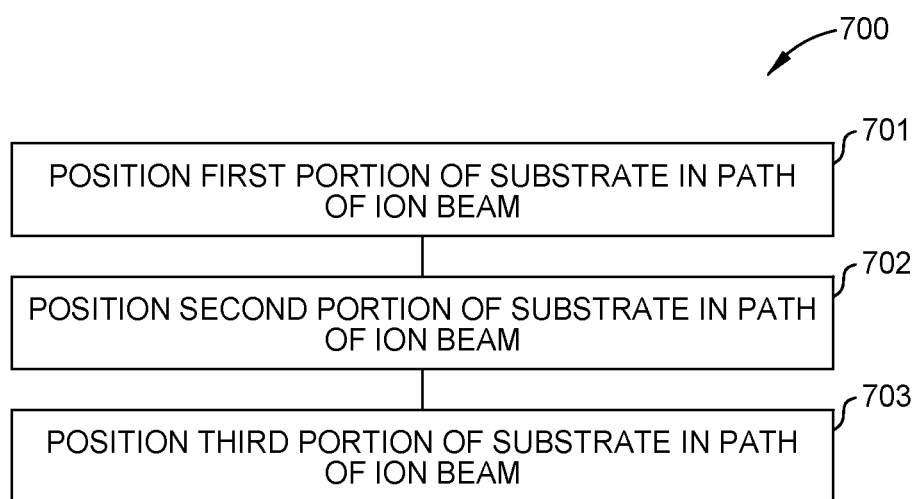
FIG. 7 is a flow diagram of a method of forming gratings with rolling-k vector slant angles according to an embodiment.

FIG. 7 is a flow diagram of a method 700 of forming gratings with rolling-k vector slant angles. To facilitate explanation, FIG. 7 will be described with reference to FIG. 2. However, it is to be noted that an angled etch system other than the variable angle etch system 200 may be utilized in conjunction with the method 700. In other embodiments, which can be combined with other embodiments described herein, the method 700 is performed by an ion beam etch system. References to an ion beam in the following may refer to the ion beam 216 of FIG. 2 and/or the ion beam 312 of FIGS. 3 and 4.

At operation 701, a first portion of a substrate 105 having a grating material 103 disposed thereon is positioned in a path of an ion beam. The ion beam with the beam angle α contacts the grating material 103 at an ion beam angle $\vartheta$ relative to a surface normal 115 of the substrate 105 and forms one or more first gratings in the grating material 103. The substrate 105 is positioned at a first rotation angle φ between the ion beam and a grating vector of the one or more first gratings. The first rotation angle φ is selected to result in the one or more first gratings having a first slant angle $\vartheta'$ relative to the surface normal 115 of the substrate. The first rotation angle φ is selected by the rotation angle φ equation of $\phi = \cos^{-1}(\tan(\vartheta')/\tan(\vartheta))$. At operation 702, a second portion of a substrate 105 having the grating material 103 disposed thereon is positioned in a path of the ion beam with the beam angle α. The ion beam contacts the grating material 103 at the ion beam angle $\vartheta$ relative to a surface normal 115 of the substrate 105 and forms one or more first gratings in the grating material 103. The substrate 105 is positioned at a second rotation angle φ between the ion beam and a grating vector of the one or more second gratings. The second rotation angle φ is greater than the first rotation angle φ is selected to result in the one or more second gratings having a second slant angle $\vartheta'$ greater than the second slant angle $\vartheta'$. At operation 703, a third portion of a substrate 105 having the grating material 103 disposed thereon is positioned in the path of the ion beam with the beam angle α. The ion beam contacts the grating material 103 at the ion beam angle $\vartheta$ relative to a surface normal 115 of the substrate 105 and forms one or more first gratings in the grating material 103. The substrate 105 is positioned at a third rotation angle φ between the ion beam and a grating vector of the one or more second gratings. The third rotation angle φ is greater than the second rotation angle φ is selected to result in the one or more third gratings having a second slant angle $\vartheta'$ different than the second slant angle $\vartheta'$. In other embodiments, which can be combined with other embodiments described herein, the rotation actuator 220 rotates the substrate 105 about the x-axis of the platen 206 to the first, second, and third rotation angles φ. The third rotation angle φ may be greater than the second rotation angle φ and the second rotation angle φ may be greater than the first rotation angle φ. The first rotation angle φ may be greater than the second rotation angle φ and the second rotation angle φ may be greater than the third rotation angle φ.

In summation, methods of forming gratings with rolling-k vector slant angles on a substrate are provided. The methods described herein may be performed in combination such that a rolling k-vector of the slant angles $\vartheta'$ of the two or more portions of gratings is provided by at least two of modulating the beam angle α, the tilt angle β, and a rotation angle φ for portions of a substrate.

While the foregoing is directed to examples of the present disclosure, other and further examples of the disclosure may be devised without departing from the basic scope thereof, and the scope thereof is determined by the claims that follow.

What is claimed is:

1. An ion beam housing, comprising:
   an ion beam source operable to project an ion beam at a beam angle;
   an electrode set positioned downstream of the ion beam source, wherein the electrode set comprises:
      a plurality of electrodes positioned along and around a beam path of the ion beam source, wherein:
         each electrode of the plurality of electrodes is coupled to a respective voltage source;
         each electrode of the plurality of electrodes is coupled to a respective actuator; and
         the plurality of electrodes comprises:
            a plurality of entrance electrodes;
            a plurality of suppression electrodes positioned downstream of the entrance electrodes; and
            a plurality of exit electrodes positioned downstream of the suppression electrodes; and
      a controller in communication with each actuator and voltage source, the controller operable to modulate the beam angle by at least one of adjusting a position of at least one of the plurality of electrodes relative to the beam path and adjusting a voltage provided to at least one of the plurality of electrodes, wherein each of the plurality of electrodes is operable to be in communication with the controller to control movement of individual electrodes relative to a midline of the beam path.

2. The ion beam housing of claim 1, wherein each of the entrance electrodes, the suppression electrodes, and the exit electrodes comprises an electrically conductive plate.

3. The ion beam housing of claim 1, wherein each of the entrance electrodes, the suppression electrodes, and the exit electrodes is coupled to a dedicated actuator.

4. The ion beam housing of claim 1, wherein each of the entrance electrodes, each of the suppression electrodes, and each of the exit electrodes comprises two conductive plates that electrically coupled to each other.

5. The ion beam housing of claim 1, wherein each of the plurality of electrodes is in communication with the controller to vary the voltage to one or more of the plurality of electrodes.

6. The ion beam housing of claim 1, wherein each of the plurality of electrodes is in communication with the controller to control movement of pairs of the plurality of electrodes relative to the midline.

7. The ion beam housing of claim 1, further comprising a vacuum pump in communication with the controller.

8. The ion beam housing of claim 1, wherein the plurality of electrodes are electrically insulated from the ion beam housing.

9. A system for forming a grating on a substrate, the system comprising:
   a platen;
   a platen actuator configured to move the platen in a scanning motion comprising movement in a y-direction and a z-direction relative to an ion beam;
   an ion beam source operable to project an ion beam at a beam angle to the platen;
   an electrode set positioned downstream of the ion beam source, wherein the electrode set comprises:
      a plurality of electrodes positioned along and around a beam path of the ion beam source, wherein:
         each electrode of the plurality of electrodes is coupled to a respective voltage source; and
         each electrode of the plurality of electrodes is coupled to a respective electrode actuator for moving a respective electrode relative to a midline of the beam path; and
      a controller in communication with each electrode actuator and voltage source, the controller operable to modulate the beam angle by at least one of adjusting a position of at least one of the plurality of electrodes relative to the midline and adjusting a voltage provided to at least one of the plurality of electrodes.

10. The system of claim 9, wherein the platen actuator is operable to tilt the platen relative to an x-axis of the ion beam.

11. The system of claim 9, wherein the ion beam source includes an electrode assembly having at least two movable electrodes disposed therein.

12. The system of claim 11, wherein the at least two movable electrodes include:
    a plurality of entrance electrodes;
    a plurality of suppression electrodes positioned downstream of the entrance electrodes; and
    a plurality of exit electrodes positioned downstream of the suppression electrodes.

13. The system of claim 12, wherein each of the entrance electrodes, the suppression electrodes, and the exit electrodes comprises an electrically conductive plate.

14. The system of claim 12, wherein each of the entrance electrodes, the suppression electrodes, and the exit electrodes is coupled to a dedicated electrode actuator.

15. The system of claim 12, wherein each of the entrance electrodes, each of the suppression electrodes, and each of the exit electrodes comprises two conductive plates that are electrically coupled to each other.

16. A method for forming a grating on a substrate, the method comprising:
    projecting an ion beam at a first beam angle from an ion beam housing to a substrate positioned in a path of the ion beam, the ion beam projected at the first beam angle forming one or more first fins on the substrate, the ion beam housing comprising:
       an ion beam source for emitting an ion beam, the ion beam source having a plurality of electrodes comprising at least two pairs of movable electrodes; and
       a controller in communication with the plurality of electrodes that controls voltage provided to the electrodes and the position of one of the two pairs of movable electrodes; and
    modulating the ion beam to a second beam angle by at least one of adjusting the voltage provided to at least one of the electrodes and adjusting the position of at least one of the two pairs of movable electrodes, the ion beam projected at the second beam angle forming one or more second fins on the substrate.

17. The method of claim 16, wherein the second beam angle is greater than the first beam angle.

18. The method of claim 16, wherein the second beam angle is less than the first beam angle.

* * * * *